(12) United States Patent
Huang et al.

(10) Patent No.: US 6,504,401 B1
(45) Date of Patent: Jan. 7, 2003

(54) CONFIGURABLE BUS HOLD CIRCUIT WITH LOW LEAKAGE CURRENT

(75) Inventors: Gubo Huang, Milpitas, CA (US); Hy V. Nguyen, San Jose, CA (US); Shankar Lakkapragada, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/006,548

(22) Filed: Nov. 30, 2001

(51) Int. Cl.[7] .......................................... H03K 19/0185
(52) U.S. Cl. ............................. 326/81; 326/86; 326/83; 326/37; 326/90
(58) Field of Search .............................. 326/37, 81, 83, 326/86, 87, 90, 119

(56) References Cited

U.S. PATENT DOCUMENTS 5,739,702 A * 4/1998 Shigehara et al. ............ 326/86
6,150,845 A * 11/2000 Morrill ......................... 326/81
6,191,607 B1 * 2/2001 Meng et al. .................. 326/37

* cited by examiner

*Primary Examiner*—Michael Tokar
*Assistant Examiner*—Vibol Tan
(74) *Attorney, Agent, or Firm*—Lois D. Cartier (57) ABSTRACT

A low-voltage output circuit configurably providing a bus-hold function and a weak pull-up function, while having only transitory leakage current through the circuit regardless of the voltage level on the pad. Thus, the output circuit can be used in low-voltage devices that interface with higher-voltage devices without paying the penalty of increased leakage current. One embodiment of the invention includes a circuit output node coupled to a configurable weak pull-up circuit, a configurable bus hold circuit, and a configurable leakage prevention circuit. The configurable circuits are controlled by configuration signals that determine which circuits are active. One embodiment is implemented as a portion of a programmable logic device (PLD), and the configuration signals are programmed into configuration memory cells as part of the configuration of the PLD.

21 Claims, 7 Drawing Sheets

CONFIGURABLE BUS HOLD CIRCUIT WITH LOW LEAKAGE CURRENT

FIELD OF THE INVENTION

The invention relates to output circuits for integrated circuits (ICs). More particularly, the invention relates to a configurable bus hold circuit having only a small and transitory leakage current.

BACKGROUND OF THE INVENTION

Integrated circuits (ICs) are growing denser and faster with every product generation. As ICs pack more and more circuitry into the same amount of silicon area and operate at higher and higher speeds, the power consumption increases rapidly. Increased power consumption is undesirable for several reasons. For example, high power consumption makes a device unsuitable for applications that run on battery power. In addition, high power consumption causes a device to give off large amounts of heat, which can be difficult and expensive to dissipate.

One method of lowering the power consumption of an IC is to decrease the operating voltage. Therefore, IC operating voltages have been steadily dropping over the years. Where once virtually all ICs operated at 5 volts, operating voltages of 3.3 volts and 2.5 volts are now common, and 1.8 volt ICs are also available. Because of this wide range of operating voltages, many ICs are designed to interface with other ICs operating at different voltage levels.

Another method of reducing power consumption is to reduce the leakage current in the device. Output circuits are significant contributors to leakage current in traditional ICs. In addition to traditional output drivers, output circuits include, for example, weak pull-up circuits and bus hold circuits.

A weak pull-up circuit (also called a "weak keeper") keeps a high voltage on an output node when no other driver is pulling the node low. Weak pull-up circuits are traditionally implemented simply by adding a weak pull-up to the output node (i.e., by inserting a small P-channel transistor, gated by ground, between the output node and power high). Because the pull-up is deliberately weak, another driver (e.g., a driver on another IC coupled to the same output node) can drive the output node low by turning on a path of normal strength between the output node and ground. However, when a pull-down is active (i.e., turned on) on the output node, the weak pull-up in series with the active pull-down provides a path between power high and ground. The resulting leakage current can be significant, particularly in today's high pad-count ICs that support wide data and address busses.

A bus hold circuit also acts to keep an output node at a known value when no other driver is active. However, a bus hold circuit is different from a weak pull-up circuit in that a bus hold circuit retains whatever value was previously on the output node. For example, if a driver on the same or another IC places a low value on the node and is then tri-stated, the bus hold circuit retains the low value on the node. Similarly, if an output driver places a high value on the node and is then tri-stated, the bus hold circuit retains the high value on the node. A bus hold circuit is traditionally implemented as a latch, e.g., as a pair of cross-coupled inverters, with one of the two inverters being a weak inverter that drives the output node.

Therefore, it is desirable to provide a configurable output circuit that provides both weak pull-up and bus hold functions and is operable at a variety of voltage levels, including lower voltages than may be placed on the output node by other drivers. It is further desirable to minimize leakage current in the configurable output circuit.

SUMMARY OF THE INVENTION

The invention provides an output circuit configurably providing a bus-hold function and a weak pull-up function, while having only a transitory leakage current through the circuit regardless of the voltage level on the pad. Thus, the output circuit of the invention can be used in low-voltage devices that interface with higher-voltage devices without paying the penalty of increased leakage current.

One embodiment of the invention includes a circuit output node coupled to a configurable weak pull-up circuit, a configurable bus hold circuit, and a configurable leakage prevention circuit.

The configurable weak pull-up circuit includes a weak pull-up coupled between the circuit output node and a power high, and a P-channel transistor coupled in series with the weak pull-up between the circuit output node and the power high. The P-channel transistor is controlled by a configuration signal to enable or disable current flow through the weak pull-up.

The configurable bus hold circuit includes first and second cross-coupled inverters. The second inverter drives the circuit output node. Thus, the two inverters function as a latch that holds the current value on the circuit output node. Each inverter can be disabled (isolated from power high and/or ground) using configuration signals, to disable the bus hold circuit.

The configurable leakage prevention circuit permits only transitory leakage current through the output circuit, regardless of the value of a voltage level externally driven onto the pad.

The configurable leakage prevention circuit includes an N-channel transistor coupled between first and second nodes, where the first node and a gate terminal of the N-channel transistor are coupled to power high. Thus, in the absence of any other stimulus, the second node is at a voltage level one N-channel transistor threshold below the power high level. Also included is a first P-channel transistor coupled between the second node and the circuit output node. A gate terminal of the first P-channel transistor is also coupled to power high. The second node gates a second P-channel transistor on a pull-up path of the output node.

In the absence of the leakage prevention circuit, and when the weak pull-up circuit is disabled, but an external source is driving the circuit output node to a level higher than power high minus one P-channel threshold voltage level, leakage current would occur through the weak pull-up circuit. The leakage prevention circuit prevents this leakage by ensuring that the second P-channel transistor (which is on the weak pull-up path) is fully off under these conditions.

In one embodiment of the invention, the configurable output circuit is implemented as a portion of a programmable logic device (PLD), and the configuration signals are programmed into configuration memory cells as part of the configuration of the PLD.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

The present invention is believed to be applicable to a variety of electronic circuits. The present invention has been found to be particularly applicable and beneficial for integrated circuits (ICs) including programmable logic devices (PLDs) such as complex programmable logic devices (CPLDs) and field programmable gate arrays (FPGAs). However, the present invention is not so limited. Further, in the following description, numerous specific details are set forth to provide a more thorough understanding of the present invention. However, it will be apparent to one skilled in the art that the present invention may be practiced without these specific details.

Figure 1:
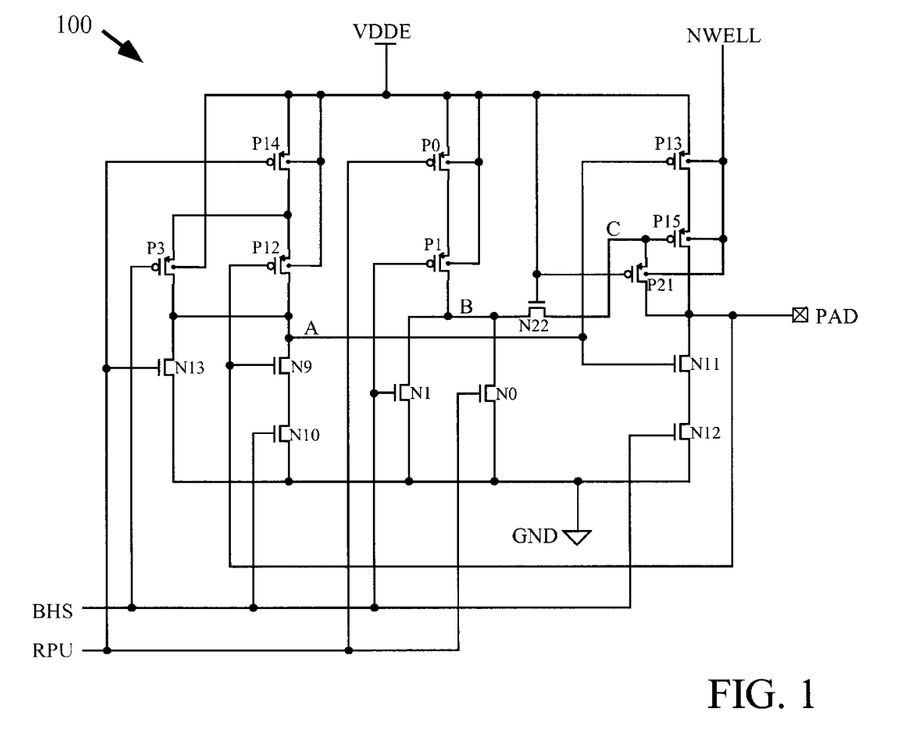
FIG. 1 is a schematic diagram of a configurable output circuit according to one embodiment of the invention.

FIG. 1 is a schematic diagram of a configurable output circuit according to one embodiment of the invention. Output circuit 100 includes P-channel transistors P3, P14, P12, P0, P1, P13, P15, and P21 and N-channel transistors N13, N9, N10, N1, N0, N22, N11, and N12.

P-channel transistors P3, P14, P12, P0, and P1 have N-wells tied to VDDE (the power high for the circuit). P-channel transistors P13, P15, and P21 have N-wells tied to node NWELL. Node NWELL can be tied to power high VDDE, or to a different voltage level. For example, when circuit output node PAD is tied to an external bus, and the bus can be driven to a value higher than VDDE, it is desirable to tie node NWELL to a voltage level at least equal to the voltage on circuit output node PAD. This is desirable because, for example, if the voltage level of the N-well is lower than the voltage on circuit output node PAD, then P-channel transistors P15 and P21 function as forward bias diodes rather than as reverse-biased diodes, which is the desired functionality.

In one embodiment, node NWELL is held at the higher of power high VDDE and the voltage on circuit output node PAD. Such N-well generation circuits are well known. For example, the XC9500XV series of CPLDs available from Xilinx, Inc. includes one such circuit that can be used to generate the NWELL voltage level in the output circuit of the invention.

P-channel transistor P12 and N-channel transistor N9 form a first inverter gated by circuit output node PAD and driving internal node A. Between the first inverter and power high VDDE (i.e., configurably disabling transistor P12) is a P-channel transistor P14 gated by configuration signal RPU. (In the present specification, the same reference characters are used to refer to terminals, signal lines, and their corresponding signals.) Between the first inverter and ground GND is an N-channel transistor N10 gated by configuration signal BHS. Coupled in parallel with P-channel transistor P12 (i.e., configurably bypassing transistor P12) is P-channel transistor P3, which is gated by configuration signal BHS. Coupled in parallel with N-channel transistors N9 and N10 is an N-channel transistor N13, which is gated by configuration signal RPU.

Thus, by controlling configuration signals BHS and RPU, node A can configurably provide a power high signal, a ground signal, or the inverse of circuit output signal PAD. Transistors N0, N1, P0, and P1 are coupled to form a NOR gate driven by configuration signals BHS and RPU. The output node of the NOR gate is designated node B. Node B is coupled through N-channel transistor N22 (which is gated by power high VDDE) to internal node C. Node C is, in turn, coupled through P-channel transistor P21 (which is gated by power high VDDE) to the circuit output node PAD.

P-channel transistors P13 and P15 are coupled in series between circuit output node PAD and power high VDDE. N-channel transistors N11 and N12 are coupled in series between circuit output node PAD and ground GND. P-channel transistor P15 is gated by node C. N-channel transistor N12 is gated by configuration signal BHS. Transistors P13 and N11 are gated by node A. Thus, when node C is low and configuration signal BHS is high, transistors P13 and N11 form a second inverter providing the inverse of signal A on circuit output node PAD.

Transistor sizes for one embodiment of output circuit 100 are shown in Table 1. Transistor sizes are given in microns, in length/width format.

TABLE 1

| Device | Size in Microns | Device | Size in Microns |
| --- | --- | --- | --- |
| P3  | 1.5/0.34 | N13 | 0.54/0.34 |
| P14 | 1.5/0.34 | N9  | 0.54/0.74 |
| P12 | 1.5/0.34 | N10 | 0.54/0.74 |
| P0  | 1.5/0.34 | N0  | 0.54/0.34 |
| P1  | 1.5/0.34 | N1  | 0.54/0.34 |
| P21 | 8/0.34   | N22 | 0.54/0.34 |
| P13 | 1.5/0.55 | N11 | 0.54/1.2  |
| P15 | 1.5/0.55 | N12 | 0.54/1.2  |

Figure 1A:
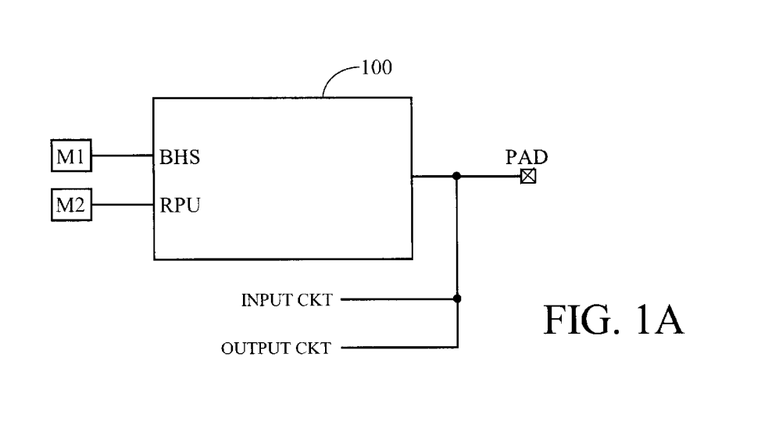
FIG. 1A shows the configurable output circuit of FIG. 1 as used in one PLD implementation.

FIG. 1A shows one application of output circuit 100 of FIG. 1. In the block diagram of FIG. 1A, output circuit 100 is included in a programmable logic device (PLD, not shown) such as a complex programmable logic device (CPLD) or a field programmable gate array (FPGA). The configuration control signals BHS and RPU are stored in configuration memory cells M1 and M2, which are programmed at the time the PLD is configured. In the pictured application, the output circuit forms a portion of an input/output circuit that also includes an output driver (OUTPUT CKT) and an input circuit (INPUT CKT). Other applications of output circuit 100 include non-programmable integrated circuits, mask-programmable logic devices such as ASICs, and electronic circuits such as discrete devices assembled on printed circuit boards.

Table 2 shows how configuration signals BHS and RPU determine the functionality of configurable output circuit 100 of FIG. 1.

TABLE 2

| BHS | RPU | Circuit Function |
|---|---|---|
| 0 | 0 | Leakage Prevention |
| 0 | 1 | Weak Pull-up |
| 1 | 0 | Bus Hold |
| 1 | 1 | Weak Pull-up |

Figure 2:
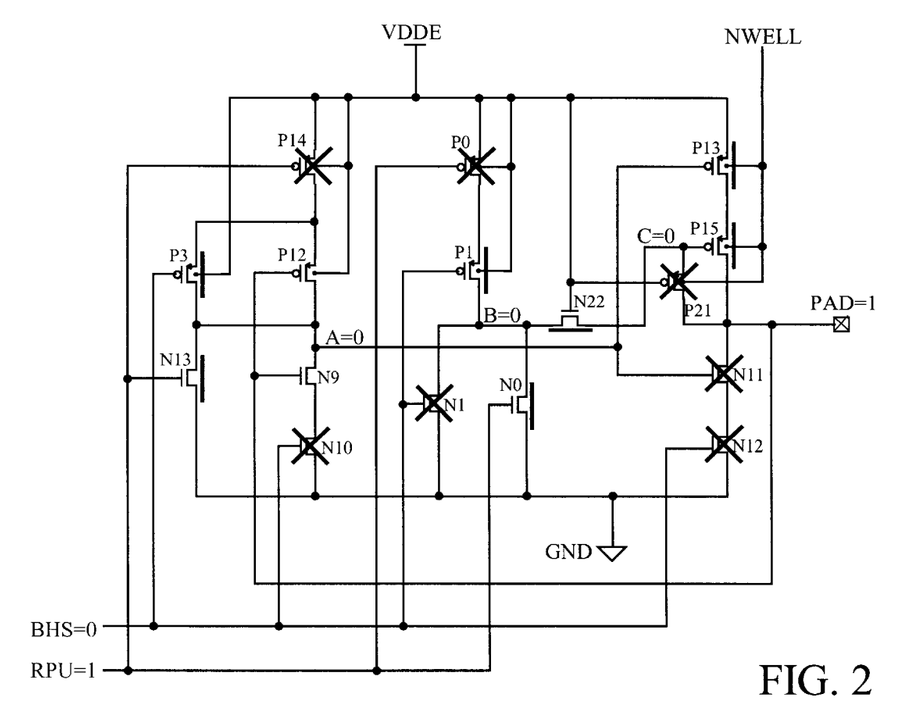
FIG. 2 illustrates the functionality of the output circuit of FIG. 1 when configured as a weak pull-up circuit using a first set of configuration signal values.

FIG. 2 illustrates the functionality of output circuit 100 of FIG. 1 when configuration signal BHS is low ("0", or ground GND) and configuration signal RPU is high ("1", or power high VDDE), i.e., when in the first of the two configurations that selects a weak pull-up functionality.

Because configuration signal BHS is low, N-channel transistors N10, N1, and N12 are off and P-channel transistors P3 and P1 are on. ("Off" transistors are designated in FIGS. 2–6 with dark "X" marks. "On" transistors are designated with dark lines paralleling the transistors.) Because configuration signal RPU is high, N-channel transistors N13 and N0 are on and P-channel transistors P14 and P0 are off.

Therefore, node A is pulled low through N-channel transistor N13, and node B is pulled low through N-channel transistor N0. N-channel transistor N22 is on and P-channel transistor P21 is off, so node C is low. Hence, P-channel transistor P15 is on. Because node A is low, P-channel transistor P13 is also on. P-channel transistors P13 and P15 form a path from power high VDDE to circuit output node PAD, and circuit output node PAD is pulled high.

However, the pull-up drive is weak, because the connection is formed via two P-channel devices (P13 and P15) in series. In one embodiment, such as that associated with Table 1, the pull-up drive is made even weaker by using P-channel transistors with a longer-than-minimum channel length to implement transistors P13 and P15.

Figure 2A:
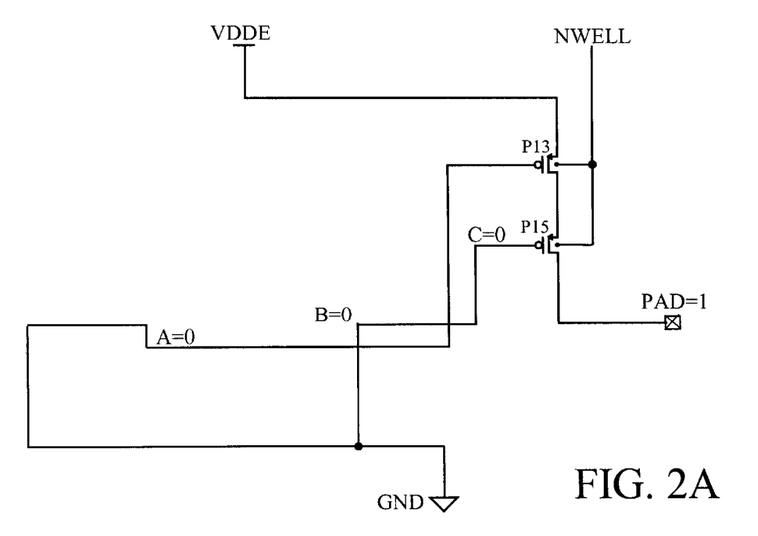
FIG. 2A shows the resulting circuit when the transistors of FIG. 2 are replaced by the equivalent opens and shorts.

FIG. 2A provides another way to view the weak pull-up circuit, in which the transistors of FIG. 2 are replaced by the equivalent opens and shorts. In other words, an "off" transistor is removed, along with the path through the transistor. An "on" transistor is removed and the path through the transistor is simply shorted together.

Figure 2B:
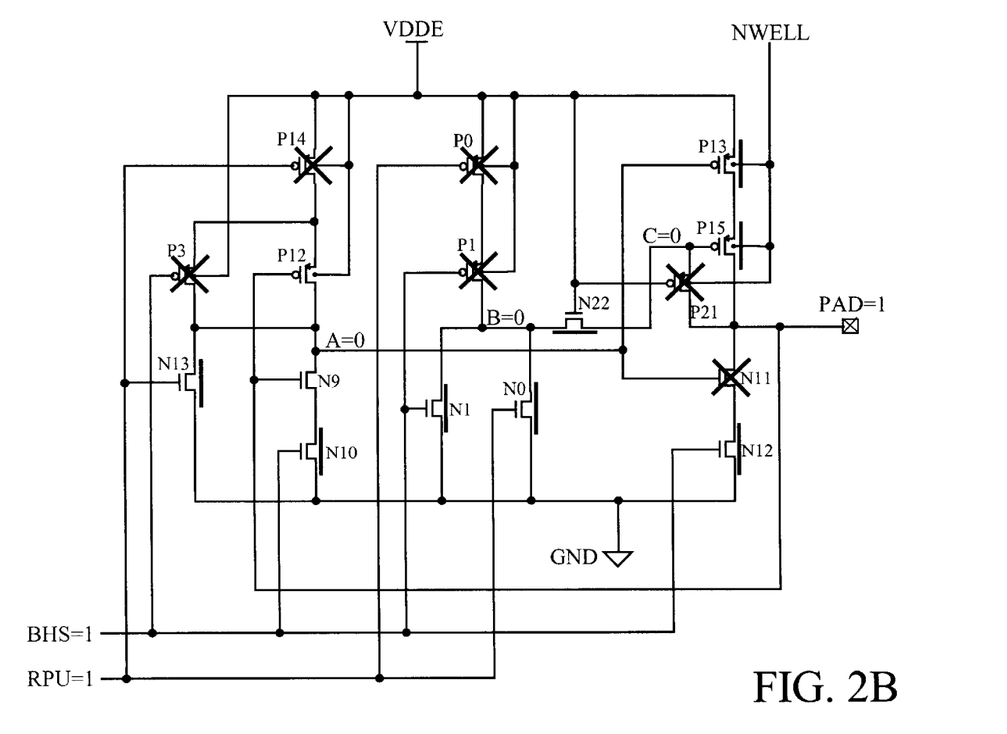
FIG. 2B illustrates the functionality of the output circuit of FIG. 1 when configured as a weak pull-up circuit using a second set of configuration signal values.

FIG. 2B illustrates the functionality of output circuit 100 of FIG. 1 when configuration signals BHS and RPU are both high, i.e., when in the second of the two configurations that selects a weak pull-up functionality.

As shown in FIG. 2B, when configuration signal BHS is high, N-channel transistors N10, N1, and N12 are on and P-channel transistors P3 and P1 are off. However, this circuit behaves the same way as the circuit shown in FIG. 2. Node A is still pulled low through N-channel transistor N13, which is still on. Node B is still low, N-channel transistor N22 is still on, and P-channel transistor P21 is still off, so node C is still low. Therefore, the simplified circuit shown in FIG. 2A also applies to this case, and the circuit functions as a weak pull-up.

Figure 3:
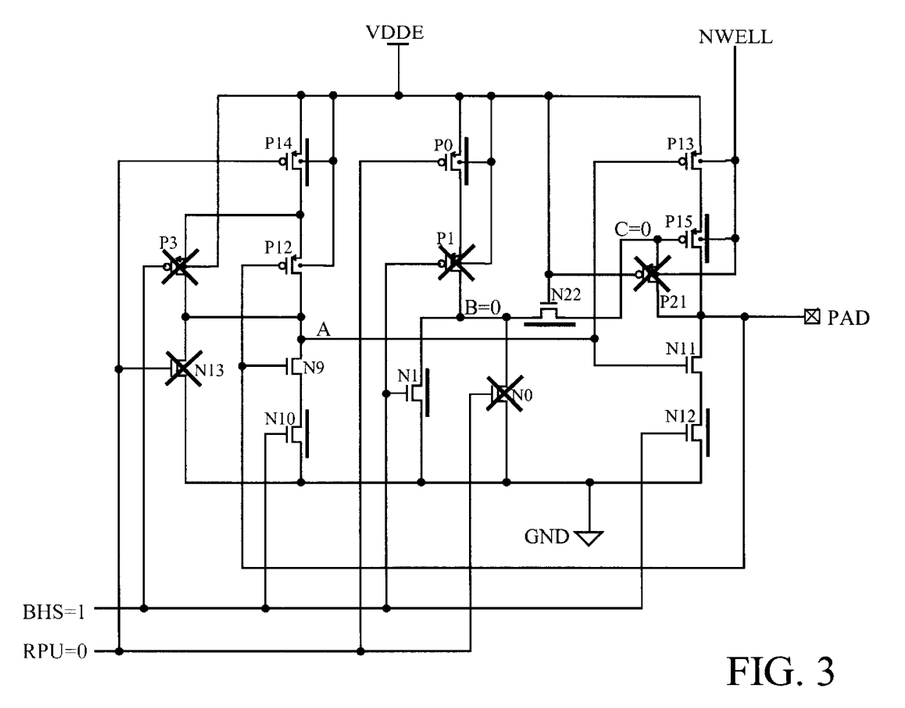
FIG. 3 illustrates the functionality of the output circuit of FIG. 1 when configured as a bus hold circuit.

FIG. 3 illustrates the functionality of output circuit 100 of FIG. 1 when configured as a bus hold circuit, i.e., when configuration signal BHS is high and configuration signal RPU is low.

Because configuration signal BHS is high, N-channel transistors N10, N1, and N12 are on and P-channel transistors P3 and P1 are off. Because configuration signal RPU is low, N-channel transistors N13 and N0 are off and P-channel transistors P14 and P0 are on.

Figure 3A:
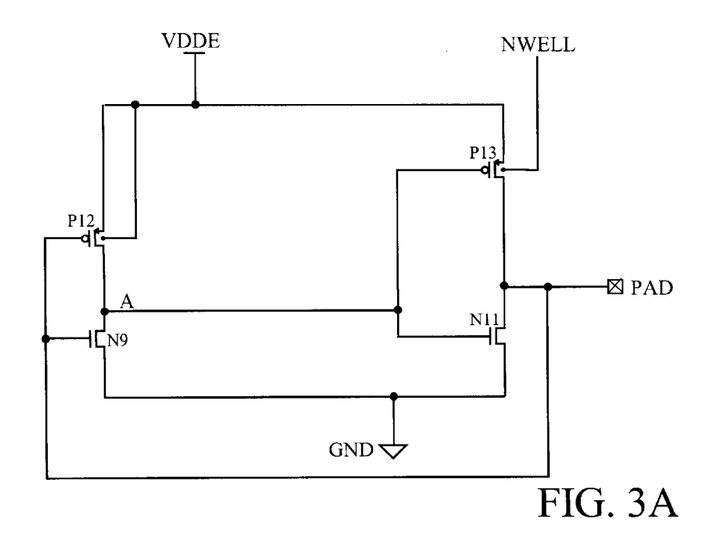
FIG. 3A shows the resulting circuit when the transistors of FIG. 3 are replaced by the equivalent opens and shorts.

Therefore, P-channel transistor P12 and N-channel transistor N9 form a first inverter gated by circuit output node PAD (see FIG. 3A). Node B is pulled low through N-channel transistor N1. N-channel transistor N22 is on and P-channel transistor P21 is off, so node C is low. Hence, P-channel transistor P15 is on. Therefore, P-channel transistor P13 and N-channel transistor N11 form a second inverter gated by node A (see FIG. 3A). The first and second inverters form a cross-coupled latch, with the output of the second inverter tied to circuit output node PAD and acting to preserve any value that is placed on circuit output node PAD and then removed.

As described above, the pull-up drive is weak, because the pull-up connection is formed via two P-channel devices (P13 and P15) in series. The pull-down drive is also relatively weak, because the pull-down connection is formed via two N-channel devices (N11 and N12) in series. In one embodiment, such as that associated with Table 1, the pull-down drive is also made weaker by using N-channel transistors with a longer-than-minimum channel length to implement transistors N11 and N12.

Figure 4:
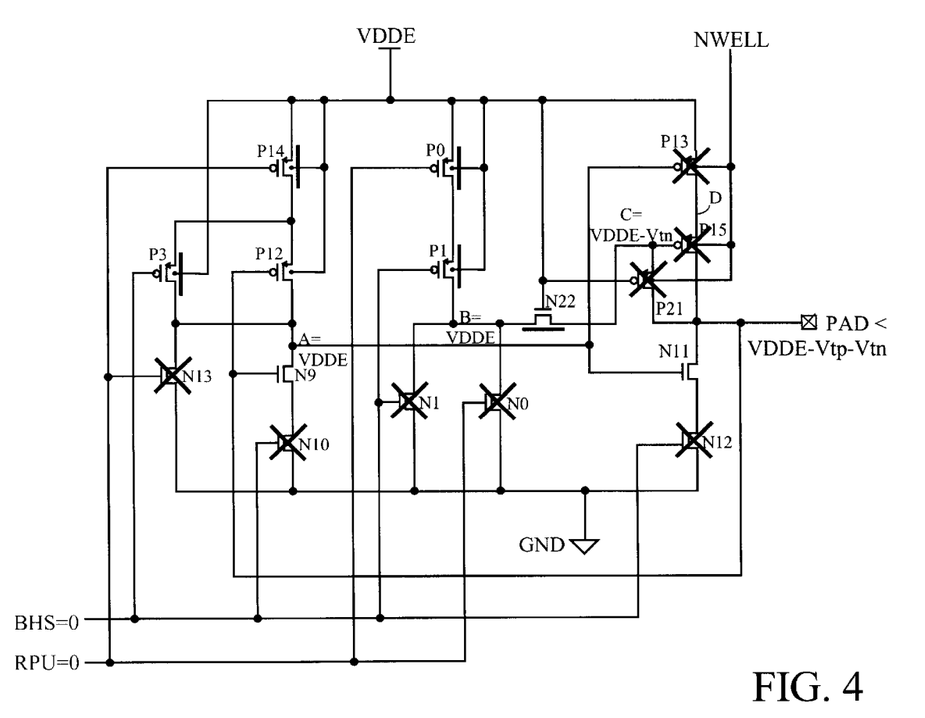
FIG. 4 illustrates the functionality of the output circuit of FIG. 1 when configured as a leakage prevention circuit, when the voltage on the output pad is within a first range of values.
Figure 5:
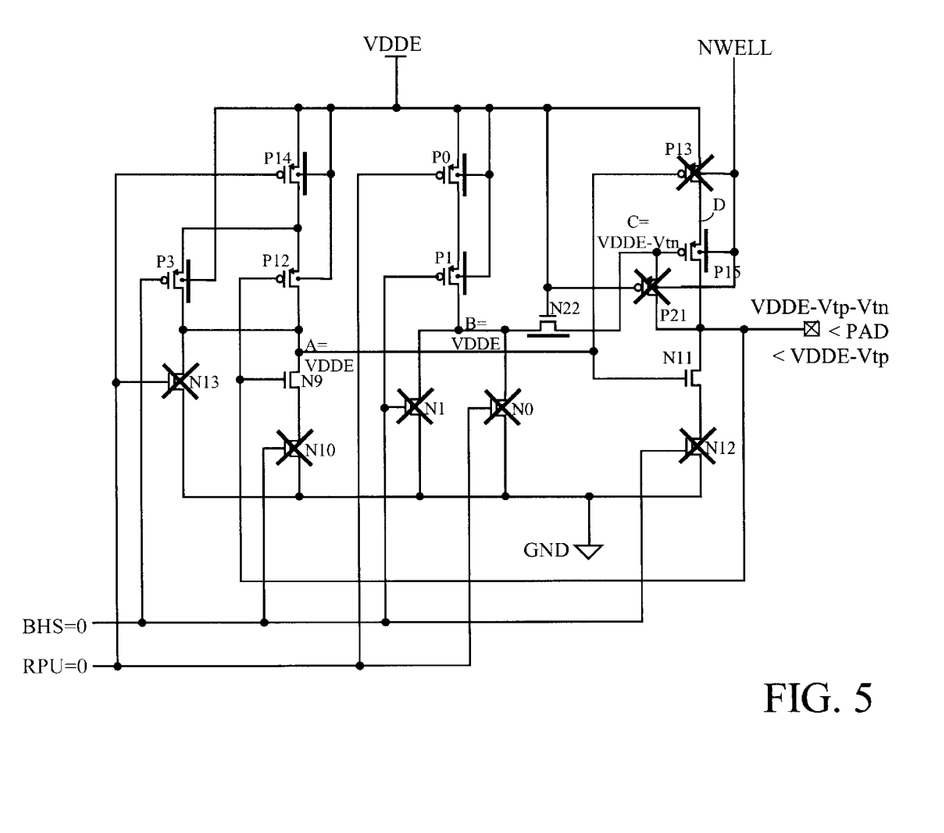
FIG. 5 illustrates the functionality of the output circuit of FIG. 1 when configured as a leakage prevention circuit, when the voltage on the output pad is within a second range of values.
Figure 6:
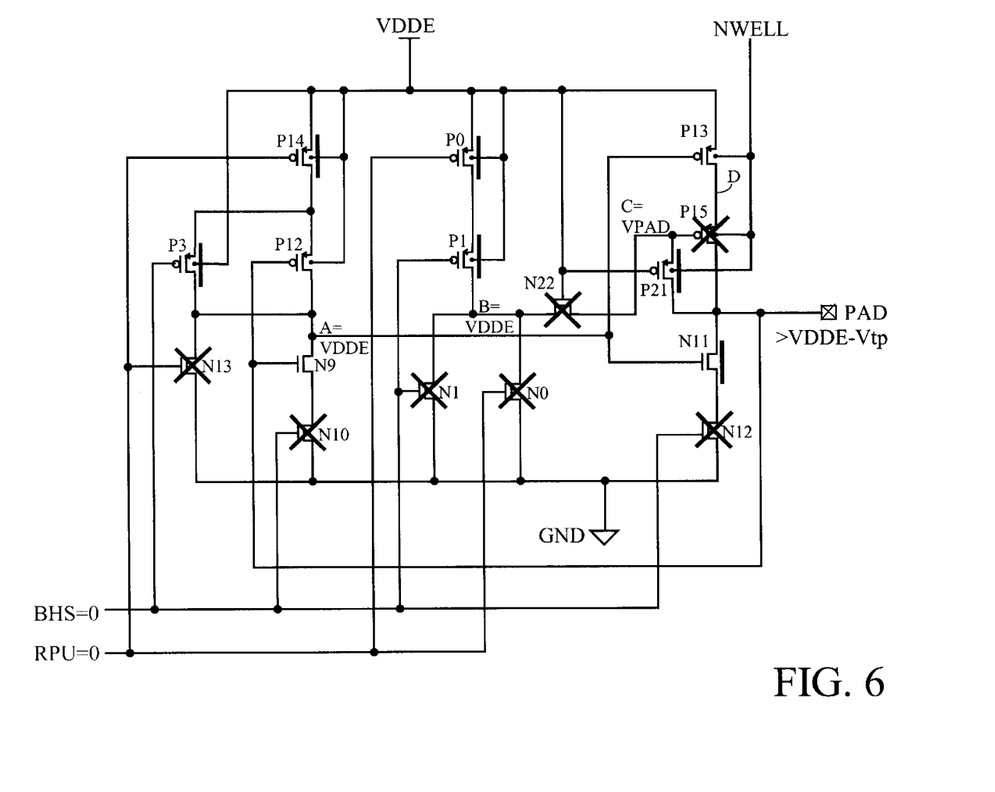
FIG. 6 illustrates the functionality of the output circuit of FIG. 1 when configured as a leakage prevention circuit, when the voltage on the output pad is within a third range of values.

FIGS. 4–6 illustrate the functionality of output circuit 100 of FIG. 1 when configured as a leakage prevention circuit, i.e., when configuration signals BHS and RPU are both low. The leakage prevention circuit functions differently depending on the voltage level on the circuit output node PAD (Vpad) relative to the power high voltage level VDDE, the P-channel transistor threshold voltage Vtp, and the N-channel transistor threshold voltage Vtn.

The voltage level placed on circuit output node PAD by an external source can be greater than, the same as, or less than the voltage level of power high VDDE. For example, the output circuit can be implemented in an IC designed to operate at power high 1.8 volts, but to interface with other ICs operating at power levels of 2.5 volts and 3.3 volts. When these various ICs all have output circuits potentially driving the same node (e.g., in an external bus), many different power level combinations can occur.

Table 3 shows the ranges of pad voltages (Vpad) that result in the circuit functionality demonstrated in FIGS. 4–6. Because Vtp is a negative value, the ranges are also given in terms of the absolute value of Vtp (|Vtp|), to show more clearly that Vpad increases from FIG. 4 through FIG. 6.

TABLE 3

| Figure | Valid Range of Vpad |
|---|---|
| 4 | Vpad < VDDE + \|Vtp\| - Vtn<br>or<br>Vpad < VDDE - Vtp - Vtn |
| 5 | VDDE + \|Vtp\| - Vtn < Vpad < VDDE + \|Vtp\|<br>or<br>VDDE - Vtp - Vtn < Vpad < VDDE - Vtp |
| 6 | Vpad > VDDE + \|Vtp\|<br>or<br>Vpad > VDDE - Vtp |

The functionality of the circuit is now described. The following discussion can be more clearly understood by visualizing the voltage on the circuit output node PAD rising (e.g., driven by an external source) through the range of values while the functionality changes from that of FIG. 4, to FIG. 5, and finally to FIG. 6.

Because configuration signal BHS is low, N-channel transistors N10, N1, and N12 are off and P-channel transistors P3 and P1 are on. Because configuration signal RPU is low, N-channel transistors N13 and N0 are off and P-channel transistors P14 and P0 are on. Therefore, node A is pulled high through P-channel transistors P14 and P3, to a value of power high VDDE. Node B is pulled high through P-channel transistors P0 and P1, to a value of power high VDDE. These transistor states and node voltage levels apply to each of FIGS. 4–6.

A P-channel transistor is on whenever the gate voltage Vg minus the source voltage Vs is less than the P-channel transistor threshold voltage Vtp, i.e., whenever Vg−Vs<Vtp. (In one embodiment, Vtp is about −0.5 volts, and in another about −0.7 volts, but this value varies in different ICs, particularly in ICs destined for "noisy" environments or in ICs designed to be used at particularly low voltages.)

Therefore, P-channel transistor P21 is on whenever VDDE (the gate voltage) minus the voltage on circuit output node PAD (Vpad, the source voltage) is less than Vtp (the P-channel transistor threshold voltage, a negative number). Hence, transistor P21 is on whenever the following conditions occur:

$Vg-Vs<Vtp\ VDDE-Vpad<Vtp-Vpad<-VDDE+Vtp\ Vpad>VDDE-Vtp$

This condition applies only to FIG. 6. (See Table 3.) Therefore, transistor P21 is off for the circuits of FIGS. 4 and 5, and on for the circuit of FIG. 6.

FIG. 4 shows the functionality of output circuit 100 of FIG. 1 when the voltage on output circuit node PAD is less than power high VDDE plus the absolute value of the P-channel transistor threshold voltage Vtp minus the N-channel transistor threshold voltage Vtn. To put this another way, FIG. 4 shows the functionality when the voltage on output circuit node PAD is less than power high VDDE minus the P-channel transistor threshold voltage Vtp minus the N-channel transistor threshold voltage Vtn. Therefore, Vpad<VDDE−Vtp−Vtn, where Vtp is a negative number and Vtn is a positive number.

An N-channel transistor is on whenever the gate voltage Vg minus the source voltage Vs is greater than the N-channel transistor threshold voltage Vtn, i.e., whenever Vg−Vs>Vtn. (In one embodiment, Vtn is about 0.5 volts, and in another about 0.7 volts, but this value also varies in different ICs.) As with any N-channel transistor, the "source" of the transistor is the one of the two data terminals that is at the lower voltage level.

The gate voltage of N-channel transistor N22 is power high VDDE. The voltage on node B is also VDDE, so node C is the source in the circuit of FIG. 4. Transistor P21 is off, as previously described, so transistor N22 is the only controlling factor for the voltage level on node C. Hence, transistor N22 is on whenever:

$Vg-Vs>Vtn\ VDDE-Vc>Vtn-Vc>-VDDE+Vtn\ Vc<VDDE-Vtn$

As long as the voltage on node C is less than VDDE minus Vtn, transistor N22 is on. Therefore, transistor N22 holds node C to a value of VDDE minus Vtn (Vc=VDDE−Vtn).

The state of P-channel transistor P15 is now examined. As described above, P-channel transistor P15 is on whenever the gate voltage minus the source voltage is less than Vtp. Transistor P15 is on whenever:

$Vg-Vs<Vtp\ Vc-Vpad<Vtp\ (VDDE-Vtn)-Vpad<Vtp-Vpad<-VDDE+Vtp+Vtn\ Vpad>VDDE-Vtp-Vtn$ It was stipulated that for the circuit of FIG. 4, Vpad<VDDE−Vtp−Vtn. Therefore, transistor P15 is off for the circuit of FIG. 4.

The state of P-channel transistor P13 is now examined. As described above, P-channel transistor P13 is on whenever the gate voltage (Va, or VDDE) minus the source voltage (Vd) is less than Vtp, where Vd is the voltage of the node D between P-channel transistors P13 and P15. Because transistor P15 is off, the voltage on node D is no higher than power high VDDE. Therefore, the gate voltage (VDDE) minus the source voltage is either zero or a positive number, and hence is greater than the P-channel transistor threshold voltage (a negative number). Transistor P13 is off in the circuit of FIG. 4.

It has been established that each of transistors P21, P13, and P15 is off in the circuit of FIG. 4. Hence, there is no path between power high VDDE and circuit output node PAD. Also, because transistor N12 is off, there is no path between circuit output node PAD and ground GND. Hence, there is no leakage current through the circuit that traverses circuit output node PAD. N-channel transistors N13, N10, N1, and N0 ensure that there are no other paths through the circuit from power high VDDE to ground GND.

FIG. 5 shows the functionality of output circuit 100 of FIG. 1 when the voltage on output circuit node PAD is greater than power high VDDE plus the absolute value of the P-channel transistor threshold voltage Vtp minus the N-channel transistor threshold voltage Vtn, but less than power high VDDE plus the absolute value of the P-channel transistor threshold voltage Vtp. To put this another way, FIG. 5 shows the functionality when the voltage on output circuit node PAD is greater than power high VDDE minus the P-channel transistor threshold voltage Vtp minus the N-channel transistor threshold voltage Vtn, but less than power high VDDE minus the P-channel transistor threshold voltage Vtp. Therefore, VDDE−Vtp−Vtn<Vpad<VDDE−Vtp, where Vtp is a negative number and Vtn is a positive number.

P-channel transistor P21 is off, as previously described, so the voltage level on node C is determined by node B and transistor N22. Therefore, as in the circuit of FIG. 4, transistor N22 holds node C to a value of VDDE minus Vtn (Vc=VDDE−Vtn).

The state of P-channel transistor P15 is now examined. As described above, P-channel transistor P15 is on whenever the gate voltage minus the source voltage is less than Vtp. Transistor P15 is on whenever:

$Vg-Vs<Vtp\ Vc-Vpad<Vtp\ (VDDE-Vtn)-Vpad<Vtp\ VDDE-Vtn-Vtp<Vpad\ VDDE-Vtp-Vtn<Vpad$ It was stipulated for the circuit of FIG. 5 that VDDE−Vtp−Vtn<Vpad. Therefore, transistor P15 is on for the circuit of FIG. 5.

The state of P-channel transistor P13 is now examined. As described above, P-channel transistor P13 is on whenever the gate voltage (Va, or VDDE) minus the source voltage (Vd) is less than Vtp. Because transistor P15 is on, the voltage on node D is the same as the voltage on circuit output node PAD (Vd=Vpad). Therefore, transistor P13 is on whenever:

$Vg-Vs<Vtp\ Va-Vd<Vtp\ VDDE-Vpad<Vtp-Vpad<-VDDE+Vtp\ Vpad>VDDE-Vtp$

It was stipulated for the circuit of FIG. 5 that Vpad<VDDE−Vtp. Therefore, transistor P13 is off for the circuit of FIG. 5.

Each of transistors P21 and P13 is off in the circuit of FIG. 5. Because transistor P13 is off, the fact that transistor P15 is on does not create a path between power high VDDE and circuit output node PAD. Also, because transistor N12 is off, there is no path between circuit output node PAD and ground GND. Hence, there is no leakage current through the circuit that traverses circuit output node PAD. N-channel transistors N13, N10, N1, and N0 ensure that there are no other paths through the circuit from power high VDDE to ground GND.

FIG. 6 shows the functionality of output circuit 100 of FIG. 1 when the voltage on output circuit node PAD is greater than power high VDDE plus the absolute value of the P-channel transistor threshold voltage Vtp. To put this another way, FIG. 6 shows the functionality when the voltage on output circuit node PAD is greater than power high VDDE minus the P-channel transistor threshold voltage Vtp. Therefore, Vpad>VDDE−Vtp, where Vtp is a negative number.

The state of P-channel transistor P13 is first examined. As described above, P-channel transistor P13 is on whenever the gate voltage (Va, or VDDE) minus the source voltage (Vd) is less than Vtp.

As the voltage on circuit output node PAD rises, the circuit switches from the functionality of FIG. 5 to the functionality of FIG. 6. At this transition point, the voltage level on circuit output node PAD equals power high VDDE minus the P-channel transistor threshold voltage Vtp (Vpad= VDDE−Vtp). Because P-channel transistor P15 is on in the circuit of FIG. 5, at the transition point between the two figures node D has the same voltage level as circuit output node PAD (Vd=Vpad=VDDE−Vtp). Therefore, for P-channel transistor P13:

$$Vg - Vs = Va - Vd$$
$$= VDDE - (VDDE - Vtp)$$
$$= VDDE - VDDE + Vtp$$
$$= Vtp$$

Hence, there is a transition point between the circuits of FIGS. 5 and 6 when P-channel transistor P13 is on. If P-channel transistor P15 is also on, there will be a leakage current through transistors P13 and P15. Therefore, to disable this leakage current, transistor P15 should turn off when the voltage on circuit output node PAD rises above VDDE− Vtp (i.e., when Vpad>VDDE−Vtp).

The state of N-channel transistor N22 is now examined. P-channel transistor P21 is on, as previously described. (It was established that transistor P21 is on whenever Vpad>VDDE−Vtp, which condition applies to FIG. 6.) Therefore, the voltage level of node C rises, through transistor P21, to a level equal to the voltage level on circuit output node PAD (Vc=Vpad).

It was stipulated for FIG. 6 that Vpad>VDDE−Vtp (i.e., Vpad>VDDE+|Vtp|). Therefore, Vpad is greater than VDDE (Vpad>VDDE). Hence, the voltage at node C is greater than VDDE (Vc>VDDE). However, the voltage at node B is still equal to power high VDDE (Vb=VDDE).

The source of an N-channel transistor is the one of the two data terminals at the lower voltage level. Therefore, in the circuit of FIG. 6, node B is the source for N-channel transistor N22. Hence, for transistor N22, Vg−Vs=VDDE− VDDE=0 volts, which is less than Vtn. N-channel transistor N22 is off in the circuit of FIG. 6.

The state of P-channel transistor P15 is now examined. P-channel transistor P15 is on whenever the gate voltage minus the source voltage is less than Vtp. P-channel transistor P15 is on whenever:

$$Vg-Vs<Vtp \quad Vc-Vpad<Vtp \quad Vpad-Vpad<Vtp \quad 0 \text{ volts}<Vtp$$

The P-channel transistor threshold voltage Vtp is always less than zero. Therefore, P-channel transistor P15 is off in the circuit of FIG. 6. Hence, the leakage current through transistors P13 and P15 is transitory, and is cut off as soon as the voltage at circuit output node PAD rises above VDDE−Vtp.

Note that in the embodiment associated with Table 1, P-channel transistor P21 is much wider than the other P-channel transistors. This extra width is to ensure that the leakage prevention circuit functions quickly, minimizing the transitory leakage current.

Because transistors P15 and N22 are off in the circuit of FIG. 6, there is no path between power high VDDE and circuit output node PAD. Also, because transistor N12 is off, there is no path between circuit output node PAD and ground GND. Hence, there is no leakage current through the circuit that traverses circuit output node PAD. N-channel transistors N13, N10, N1, and N0 ensure that there are no other paths through the circuit from power high VDDE to ground GND.

Those having skill in the relevant arts of the invention will now perceive various modifications and additions that may be made as a result of the disclosure herein. For example, the above text describes the output circuits of the invention in the context of ICs including PLDs. However, the invention can also be applied to other fields of the electronic design art. Further, inverters, transistors, pull-ups, pull-downs, and NOR gates other than those described herein can be used to implement the invention. Moreover, some components are shown directly connected to one another while others are shown connected via intermediate components. In each instance, the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A configurable output circuit, comprising:
   a circuit output node;
   a configurable weak pull-up circuit coupled to the circuit output node;
   a configurable bus hold circuit coupled to the circuit output node; and
   a configurable leakage prevention circuit coupled to the circuit output node.

2. The configurable output circuit of claim 1, wherein the configurable weak pull-up circuit, the configurable bus hold circuit, and the configurable leakage prevention circuit share transistors in common.

3. The configurable output circuit of claim 1, wherein the configurable output circuit forms a portion of an integrated circuit (IC), the configurable output circuit further comprising an input/output pad coupled to the circuit output node.

4. The configurable output circuit of claim 1, wherein the configurable weak pull-up circuit comprises:
   a weak pull-up coupled between the circuit output node and a power high node; and
   means for configurably disabling the weak pull-up.

5. The configurable output circuit of claim 4, wherein the means for configurably disabling the weak pull-up comprises another pull-up coupled in series with the weak pull-up between the circuit output node and the power high node, the another pull-up having a gate terminal controlled by a configuration signal.

6. The configurable output circuit of claim 5, wherein the configurable output circuit comprises a portion of a programmable logic device, and the configuration signal is stored in a configuration memory cell.

7. The configurable output circuit of claim 1, wherein the configurable bus hold circuit comprises:
   a first inverter comprising a first pull-up and a first pull-down, the first inverter having an output node;
   means for configurably disabling the first pull-up;
   means for configurably disabling the first pull-down;
   a second inverter comprising a second pull-up and a second pull-down each having gate terminals coupled to the output node of the first inverter, the second inverter having an output node coupled to gate terminals of the first pull-up and the first pull-down and further coupled to the circuit output node;
   means for configurably disabling the second pull-up; and
   means for configurably disabling the second pull-down.

8. The configurable output circuit of claim 7, wherein:
   the means for configurably disabling the first pull-up comprises a first another pull-up coupled in series with the first pull-up and having a gate terminal controlled by a first configuration signal;
   the means for configurably disabling the first pull-down comprises a first another pull-down coupled in series with the first pull-down and having a gate terminal controlled by a second configuration signal;
   the means for configurably disabling the second pull-up comprises a second another pull-up coupled in series with the second pull-up and having a gate terminal controlled by a third configuration signal; and
   the means for configurably disabling the second pull-down comprises a second another pull-down coupled in series with the second pull-down and having a gate terminal controlled by a fourth configuration signal.

9. The configurable output circuit of claim 8, wherein:
   the second and fourth configuration signals are the same signal; and
   the third configuration signal is the NOR function of the first and second configuration signals.

10. The configurable output circuit of claim 9, wherein:
    the configurable output circuit comprises a portion of a programmable logic device; and
    the first and second configuration signals are stored in configuration memory cells.

11. The configurable output circuit of claim 1, wherein the configurable leakage prevention circuit comprises:
    a first node configurably coupled to a power high node;
    a second node;
    an N-channel transistor coupled between the first and second nodes, the N-channel transistor having a gate terminal coupled to the power high node;
    a P-channel transistor coupled between the second node and the circuit output node, the P-channel transistor having a gate terminal coupled to the power high node; and
    a pull-up coupled between the circuit output node and the power high node, the pull-up having a gate terminal coupled to the second node.

12. The configurable output circuit of claim 11, wherein the configurable output circuit forms a portion of an integrated circuit (IC), the configurable output circuit further comprising an input/output pad coupled to the circuit output node.

13. The configurable output circuit of claim 12, wherein the input/output pad is coupled to one bit of a bus coupling the IC to at least one other IC in an electronic system.

14. The configurable output circuit of claim 13, wherein the circuit output node is externally driven through the input/output pad by the other IC to a voltage level at least an absolute value of a P-channel threshold voltage higher than a voltage level of the power high node.

15. A configurable leakage prevention circuit, comprising:
    a circuit output node;
    a first node configurably coupled to a power high node;
    a second node;
    an N-channel transistor coupled between the first and second nodes, the N-channel transistor having a gate terminal coupled to the power high node;
    a P-channel transistor coupled between the second node and the circuit output node, the P-channel transistor having a gate terminal coupled to the power high node; and
    a pull-up coupled between the circuit output node and the power high node, the pull-up having a gate terminal coupled to the second node.

16. The configurable leakage prevention circuit of claim 15, wherein the configurable leakage prevention circuit forms a portion of an integrated circuit (IC), the configurable leakage prevention circuit further comprising an input/output pad coupled to the circuit output node.

17. The configurable leakage prevention circuit of claim 16, wherein the input/output pad is coupled to one bit of a bus coupling the IC to at least one other IC in an electronic system.

18. The configurable leakage prevention circuit of claim 17, wherein the input/output pad is externally driven through the input/output pad by the other IC to a voltage level at least an absolute value of a P-channel threshold voltage higher than a voltage level of the power high node.

19. A configurable output circuit, comprising:
    a first inverter comprising a first pull-up and a first pull-down, the first inverter having an output node;
    means for configurably disabling the first pull-up;
    means for configurably disabling the first pull-down;
    means for configurably bypassing the first pull-up;
    means for configurably bypassing the first pull-down;
    a first node;
    means for configurably pulling up the first node;
    means for configurably pulling down the first node;
    a second node;
    an N-channel transistor coupled between the first and second nodes, the N-channel transistor having a gate terminal coupled to a power high node;
    a second inverter comprising a second pull-up and a second pull-down each having gate terminals coupled to the output node of the first inverter, the second inverter having an output node coupled to gate terminals of the first pull-up and the first pull-down;
    means, controlled by a value on the second node, for configurably disabling the second pull-up;
    means for configurably disabling the second pull-down;
    a P-channel transistor coupled between the second node and the output node of the second inverter, the P-channel transistor having a gate terminal coupled to the power high node; and
    a circuit output terminal coupled to the output terminal of the second inverter.

20. A configurable output circuit, comprising:
    an output node;

means for configurably applying a weak pull-up function to the output node;

means for configurably applying a bus hold function to the output node; and means for configurably placing the output circuit in a leakage prevention mode wherein the weak pull-up function and the bus hold function are disabled and no path exists between power high and ground through the configurable output circuit.

21. The configurable output circuit of claim 20, wherein the means for configurably placing the output circuit in a leakage prevention mode comprises means for isolating the output node from the means for configurably applying a weak pull-up function to the output node and the means for configurably applying a bus hold function to the output node.

* * * * *